United States Patent
Lenox

(10) Patent No.: US 8,572,836 B2
(45) Date of Patent: Nov. 5, 2013

(54) METHOD OF MANUFACTURING A LARGE-AREA SEGMENTED PHOTOVOLTAIC MODULE

(75) Inventor: Carl Lenox, Oakland, CA (US)

(73) Assignee: SunPower Corporation, San Jose, CA (US)

( * ) Notice: Subject to any disclaimer, the term of this patent is extended or adjusted under 35 U.S.C. 154(b) by 652 days.

(21) Appl. No.: 12/763,067

(22) Filed: Apr. 19, 2010

(65) Prior Publication Data

US 2011/0253188 A1    Oct. 20, 2011

(51) Int. Cl.
*H01S 4/00* (2006.01)

(52) U.S. Cl.
USPC ............ 29/592.1; 29/825; 126/685; 156/79

(58) Field of Classification Search
USPC ............... 29/825, 592.1; 156/79; 126/685
See application file for complete search history.

(56) References Cited

U.S. PATENT DOCUMENTS

| | | | | |
|---|---|---|---|---|
| 3,713,727 | A | * | 1/1973 | Markosian et al. ............ 359/853 |
| 3,855,027 | A | * | 12/1974 | Erdmann et al. ............... 156/79 |
| 3,977,773 | A | * | 8/1976 | Hubbard ....................... 359/853 |
| 4,352,112 | A | * | 9/1982 | Leonhardt et al. ............. 343/915 |
| 4,432,342 | A | * | 2/1984 | Lucas et al. .................... 126/570 |
| 4,535,961 | A | * | 8/1985 | Sobczak et al. ............ 248/183.2 |
| 4,582,953 | A | | 4/1986 | Nagase et al. |
| 5,268,038 | A | | 12/1993 | Riermeier et al. |
| 6,093,884 | A | * | 7/2000 | Toyomura et al. ............. 136/244 |
| 6,182,403 | B1 | | 2/2001 | Mimura et al. |
| 6,239,352 | B1 | * | 5/2001 | Luch ............................. 136/244 |
| 6,462,265 | B1 | | 10/2002 | Sasaoka et al. |
| 6,525,262 | B1 | | 2/2003 | Makita et al. |
| 6,546,535 | B1 | | 4/2003 | Nagao et al. |
| 7,419,377 | B1 | | 9/2008 | Briere et al. |
| 7,445,488 | B2 | | 11/2008 | Feldmeier et al. |
| 2005/0022859 | A1 | | 2/2005 | Nass et al. |
| 2005/0178428 | A1 | | 8/2005 | Laaly et al. |
| 2007/0137689 | A1 | | 6/2007 | Feldmeier et al. |
| 2008/0142071 | A1 | * | 6/2008 | Dorn et al. .................... 136/245 |
| 2009/0014058 | A1 | | 1/2009 | Croft et al. |
| 2009/0293941 | A1 | | 12/2009 | Luch |
| 2009/0308434 | A1 | | 12/2009 | Franceschini |
| 2009/0314335 | A1 | | 12/2009 | McClintock |
| 2009/0320905 | A1 | | 12/2009 | Botkin et al. |
| 2010/0037932 | A1 | | 2/2010 | Erez et al. |
| 2010/0139742 | A1 | | 6/2010 | Wayman et al. |
| 2011/0247679 | A1 | * | 10/2011 | Shelef et al. .................. 136/246 |

FOREIGN PATENT DOCUMENTS

| | | |
|---|---|---|
| WO | 2008/148524 A2 | 12/2008 |
| WO | WO 2009/086241 A2 | 7/2009 |
| WO | WO 2009/138868 A2 | 11/2009 |

OTHER PUBLICATIONS

PCT International Search Report for Application No. PCT/US2011/023301, Apr. 14, 2011, 2 sheets.

* cited by examiner

*Primary Examiner* — Carl Arbes
(74) *Attorney, Agent, or Firm* — Okamoto & Benedicto LLP

(57) ABSTRACT

One embodiment of the invention relates to a segmented photovoltaic (PV) module which is manufactured from laminate segments. The segmented PV module includes rectangular-shaped laminate segments formed from rectangular-shaped PV laminates and further includes non-rectangular-shaped laminate segments formed from rectangular-shaped and approximately-triangular-shaped PV laminates. The laminate segments are mechanically joined and electrically interconnected to form the segmented module. Another embodiment relates to a method of manufacturing a large-area segmented photovoltaic module from laminate segments of various shapes. Other embodiments relate to processes for providing a photovoltaic array for installation at a site. Other embodiments and features are also disclosed.

7 Claims, 12 Drawing Sheets

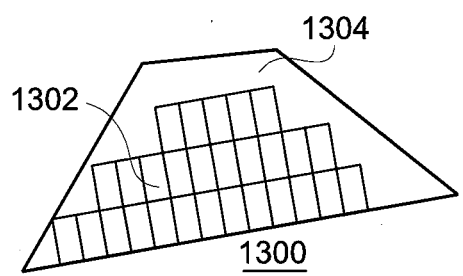
FIG. 13A
(Conventional)

METHOD OF MANUFACTURING A LARGE-AREA SEGMENTED PHOTOVOLTAIC MODULE

STATEMENT REGARDING FEDERALLY SPONSORED RESEARCH OR DEVELOPMENT

This invention was made with Government support under Contract No. DEFC36-07GO17043 awarded by the United States Department of Energy. The Government has certain rights in this invention.

BACKGROUND OF THE INVENTION

1. Field of the Invention

The present invention relates generally to photovoltaic modules and processes for manufacturing and installing photovoltaic modules.

2. Description of the Background Art

Photovoltaic (PV) cells, also referred to as "solar cells," are well known devices for converting solar radiation to electrical energy. Photovoltaic cells may be packaged together in a photovoltaic module. The PV module may include a plurality of interconnected photovoltaic cells in a laminate, and an external junction box attached to the laminate, including leads and connectors which allow modules to be interconnected electrically.

PV modules are typically installed on a support structure at the installation site. The PV modules are typically then electrically interconnected with the leads from one module to the next in series, or to a common bus in parallel, or a combination of series and parallel connections.

SUMMARY

One embodiment of the invention relates to a segmented photovoltaic (PV) module which is manufactured from laminate segments. The segmented PV module includes rectangular-shaped laminate segments formed from rectangular-shaped PV laminates and further includes non-rectangular-shaped laminate segments formed from rectangular-shaped and approximately-triangular-shaped PV laminates. The laminate segments are mechanically joined and electrically interconnected to form the segmented module.

Another embodiment relates to a method of manufacturing a large-area segmented photovoltaic module from laminate segments of various shapes. The method is performed at a manufacturing facility. A plurality of the laminate segments of various shapes are mechanically joined to fill a predetermined envelope for the segmented photovoltaic module. Electrical interconnections are made between the plurality of laminate segments, and a protective cover is formed over the electrical interconnections. A junction box is integrated with the module for connecting to the segmented photovoltaic module.

Another embodiment relates to a process for providing a photovoltaic array for installation at a site. Survey data of the site at which the photovoltaic array is to be installed is received. A determination is made of a customized envelope which defines a selected area of the site. A corresponding set of laminate segments which are designed to be arranged to cover the selected area, and includes non-rectangular-shaped laminate segments, is determined.

Another embodiment pertains to another process for providing a photovoltaic array for installation at a site. Survey data of the site at which the photovoltaic array is to be installed is received. A determination is made of a customized envelope which defines a selected area of the site. In this process, a custom set of pre-fabricated segmented modules which are designed to be arranged to cover the selected area, and includes non-rectangular-shaped segmented modules, is determined.

These and other embodiments and features of the present invention will be readily apparent to persons of ordinary skill in the art upon reading the entirety of this disclosure, which includes the accompanying drawings and claims.

BRIEF DESCRIPTION OF THE DRAWINGS

FIG. 13A depicts the surface coverage on a section of a roof using an arrangement of conventional rectangular PV modules.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Segmented Large-Area Photovoltaic Module

Figure 1:
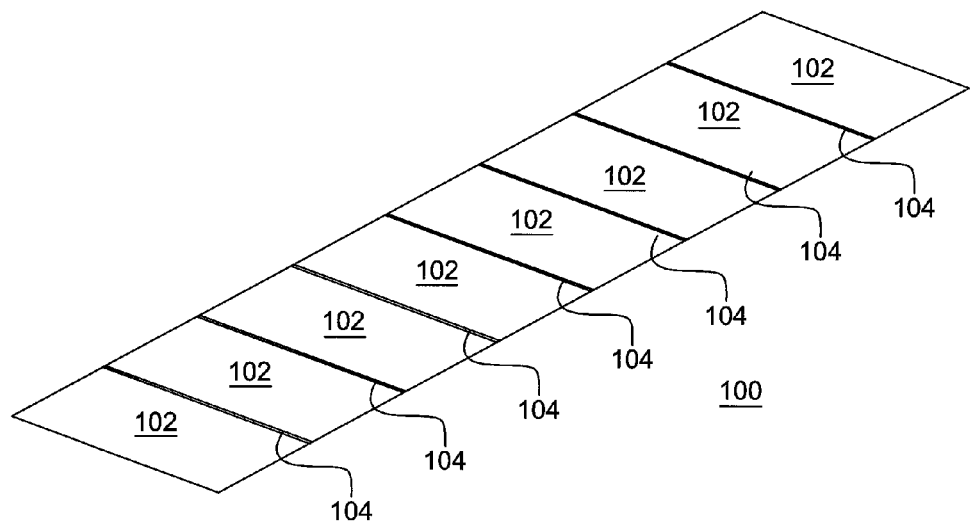
FIG. 1 is a perspective view of the front-side of a segmented large-area PV module in accordance with an embodiment of the invention.

FIG. 1 is a perspective view of the front-side of a segmented large-area PV module 100 in accordance with an embodiment of the invention. In this view, the segmented large-area PV module 100 is shown, including the front-side (light-receiving side) 102 of the rectangular laminate segments and the front-side material or pieces 104 of the joints therebetween. Each laminate segment may include a laminate with a plurality of solar cells therein. The joints interconnect the adjacent segments, both mechanically and electrically.

In this embodiment, the segmented large-area PV module 100 comprises multiple rectangular laminate segments 102 which are joined into a single very large module. Such a very large module may be used on a tracker, for example. In other embodiments, the laminate segments may be of various shapes, rectangular and non-rectangular, and may be interconnected to fill various shapes of envelopes.

Figure 2:
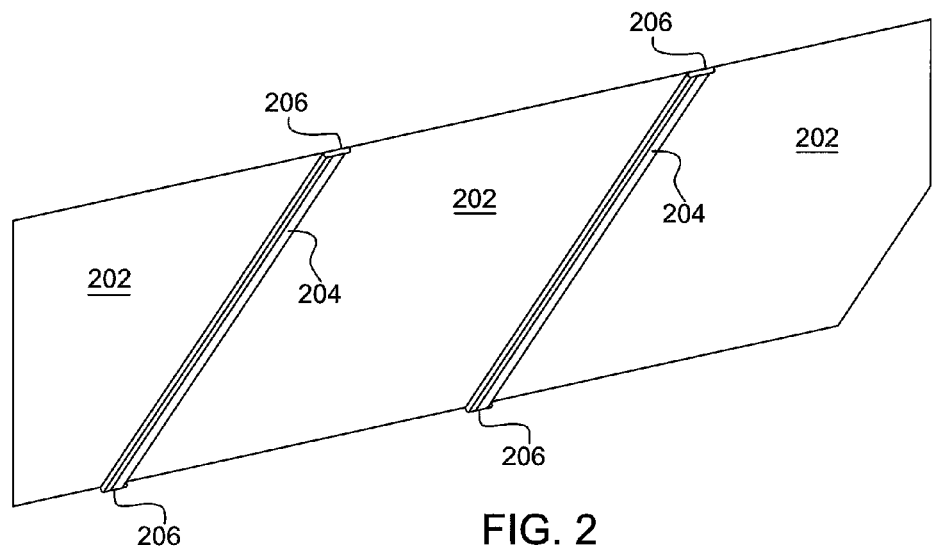
FIG. 2 is a perspective view of the back-side of the segmented large-area PV module of FIG. 1 in accordance with an embodiment of the invention.

FIG. 2 is a perspective view of the back-side of the segmented large-area PV module of FIG. 1 in accordance with an embodiment of the invention. In this view, the back-side 202 of the rectangular laminate segments and the back-side channels 204 of the joints are shown. Also shown in FIG. 3 are caps (flat end parts) 206 at the ends of the joints.

Figure 3:
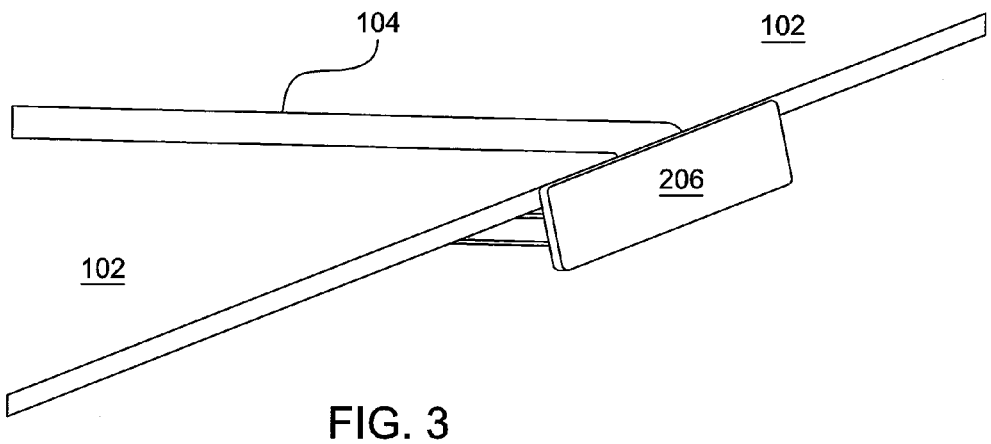
FIG. 3 is a close-up perspective view of the front-side of one end of a joint between two laminate segments of the segmented large-area PV module of FIG. 1 in accordance with an embodiment of the invention.

FIG. 3 is a close-up perspective view of the front-side of one end of a joint between two laminate segments of the segmented large-area PV module of FIG. 1 in accordance with an embodiment of the invention. This perspective shows the front-side 102 of the two adjacent laminate segments, the front-side material or piece 104 of the joint between them, and an end cap 206 of that joint.

Figure 4:
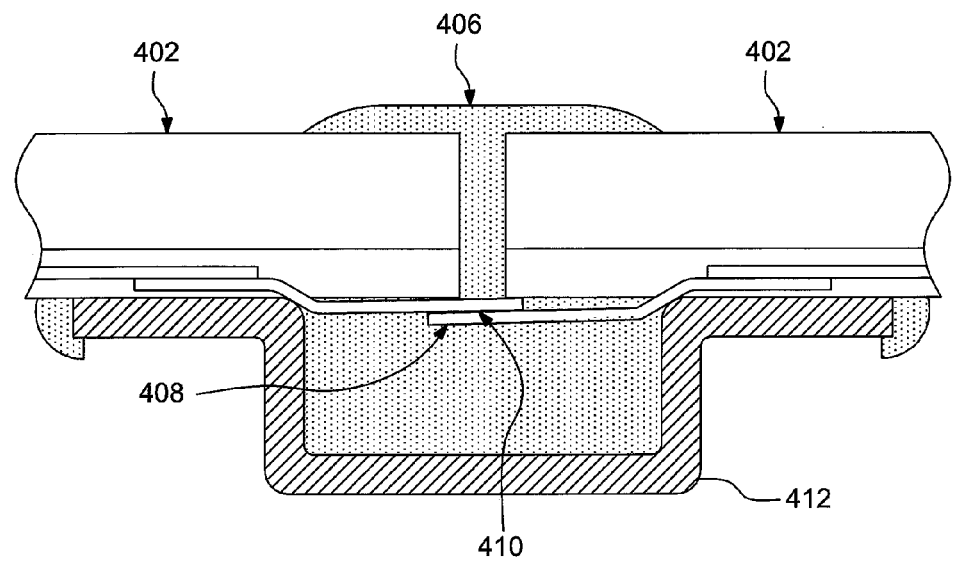
FIG. 4 is a cross-sectional view of a joint between two laminate segments of the segmented large-area PV module of FIG. 1 in accordance with an embodiment of the invention.

FIG. 4 is a cross-sectional view of a joint between two laminate segments of the segmented large-area PV module of FIG. 1 in accordance with an embodiment of the invention. Shown in FIG. 4 are two PV laminates (laminate segments) 402, each laminate 402 including a plurality of solar cells and electrical connections between the solar cells. Bypass diodes may also be embedded within the PV laminates. The specific configuration for the electrical connections and bypass diodes within a PV laminate 402 depends on the specific implementation used.

As further shown, each PV laminate 402 includes at least one exit tab 408. Typically, exit tabs 408 are included on two opposing sides for each laminate 402. The exit tab 408 comprises a non-insulated conductive portion (typically, a metal) which extends out of the PV laminate. In one embodiment, each PV laminate 402 includes two exit tabs 408. Each exit tab 408 is electrically connected within the PV laminate 402 to at least one of the solar cells. For example, the exit tab 408 may be electrically connected to a solar cell in a corner position within the PV laminate 402.

An optional electrical junction box or other stiffening structure (stiffener) 412 is also shown in FIG. 4. As shown, the stiffening structure 412 may be located on one side of the PV laminates 402 and may partially enclose the exit tabbing 408.

In accordance with an embodiment of the invention, a solder connection or solder joint 410 may be formed during the manufacturing process in a factory to electrically connect in a permanent manner the exit tabbing 408 from the two PV laminates 402. After forming the solder connection 410, an encapsulant (potting) material 406 may be introduced to electrically-insulate and environmentally-protect the exit tabbing 408 and solder connection 410. The encapsulant material 406 is preferably elastomeric so as to be resistant to cracking.

Figure 5:
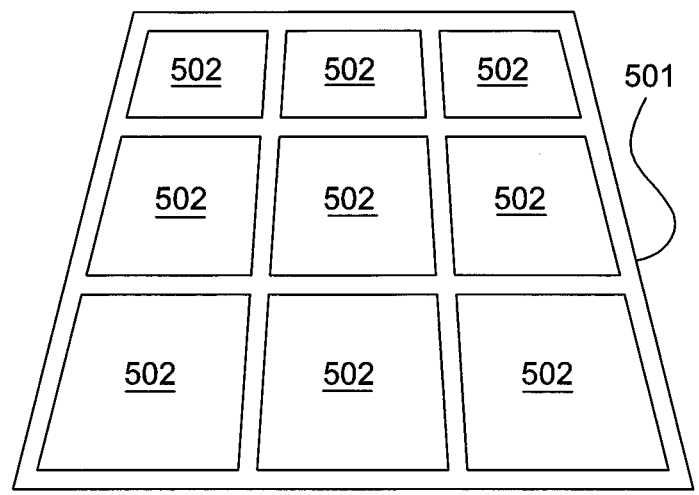
FIG. 5 is a photographic image showing a rigid polymeric frame created to support a plurality of laminate segments forming a prototype of a larger segmented PV module in accordance with an embodiment of the invention.

In accordance with an embodiment of the invention, the laminate segments may be combined or joined together, both mechanically and electrically, during the manufacturing process so as to create larger segmented modules. For instance, FIG. 5 shows a rigid polymeric perimeter frame 501 which was used in a small-scale prototype to provide support for elastomeric potted joints between the nine rectangular laminate segments in a three-by-three array. The nine rectangular laminate segments were arranged in the nine array spaces 502. In this case, the segmented module is formed by the three-by-three arrangement of joined segments. Of course, other shapes and sizes of segmented modules may be created.

Figure 6:
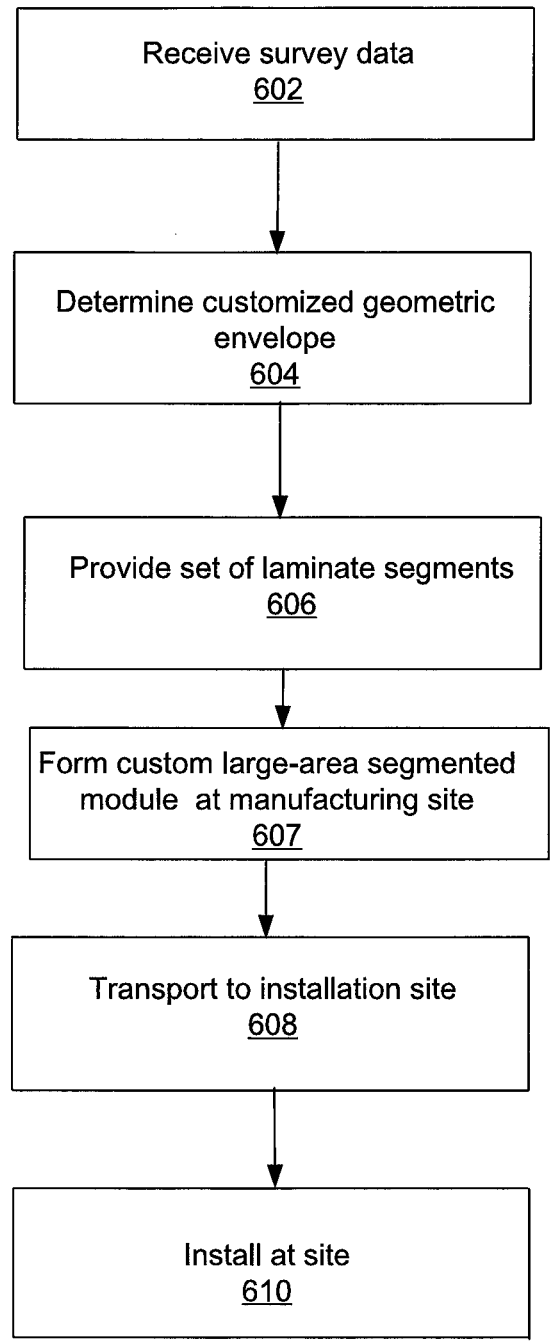
FIG. 6 is a flow chart of a process for creating and installing a segmented large-area PV module in accordance with an embodiment of the invention.

FIG. 6 is a flow chart of a process 600 for creating and installing a segmented large-area PV module in accordance with an embodiment of the invention. This process 600 shows an exemplary process that efficiently generates a customized set of laminate segments which is used form the segmented large-area PV module that is installed.

Figure 7:
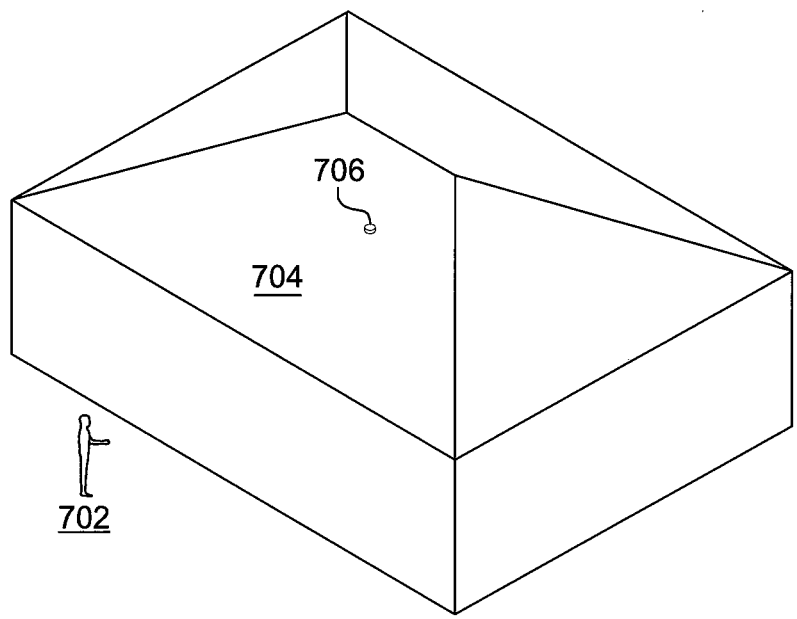
FIG. 7 depicts an example site survey to capture an as-built roof area.

As seen in FIG. 6, survey data is received 602. The survey data may be received electronically (for example, via a network connection) from a site survey that accurately captures geometric angles and dimensions of the area on which the PV modules are to be installed. The location and dimensions of obstructions may also be included in the survey data. Tools which may be used to perform the site survey include high-definition surveying (HDS) systems, differential global positioning system (DGPS), satellite imagery or aerial photography, and laser templating tools. For example, FIG. 7 depicts a site surveyor 702 capturing survey data for an as-built roof area 704 including an obstruction 706.

Figure 8A:
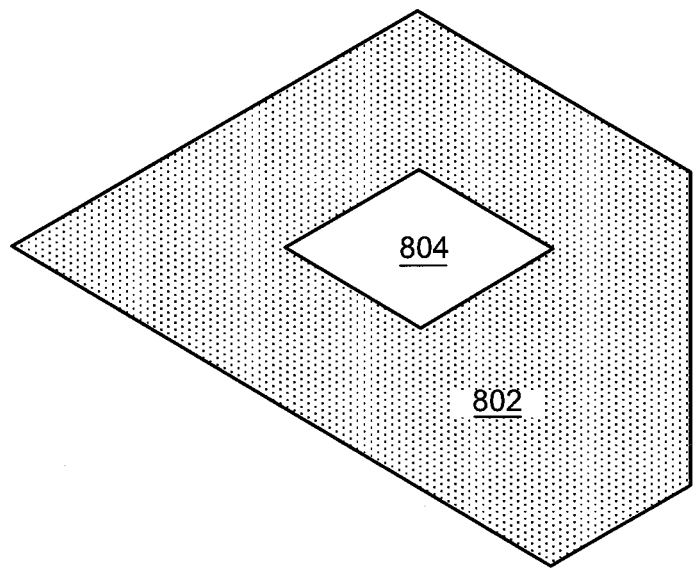
FIG. 8 depicts the formation of an example segmented large-area module for the as-built roof area in accordance with an embodiment of the invention.

The survey data is then processed to determine 604 a customized geometric envelope for the installation of a solar array. The customized geometric envelope is designed such that it may be filled using an arrangement of laminate segments to build one or more segmented modules. For example, FIG. 8A depicts a particular geometric envelope 802 which may be determined for the as-built roof area 804 shown in FIG. 7. In this example, the area of the envelope 802 includes an opening 804 which is designed to fit around the obstruction 706 in the roof area 704. In addition, other documentation and calculations may be generated, such as permit submittals, energy simulations, and so forth.

Figure 8B:
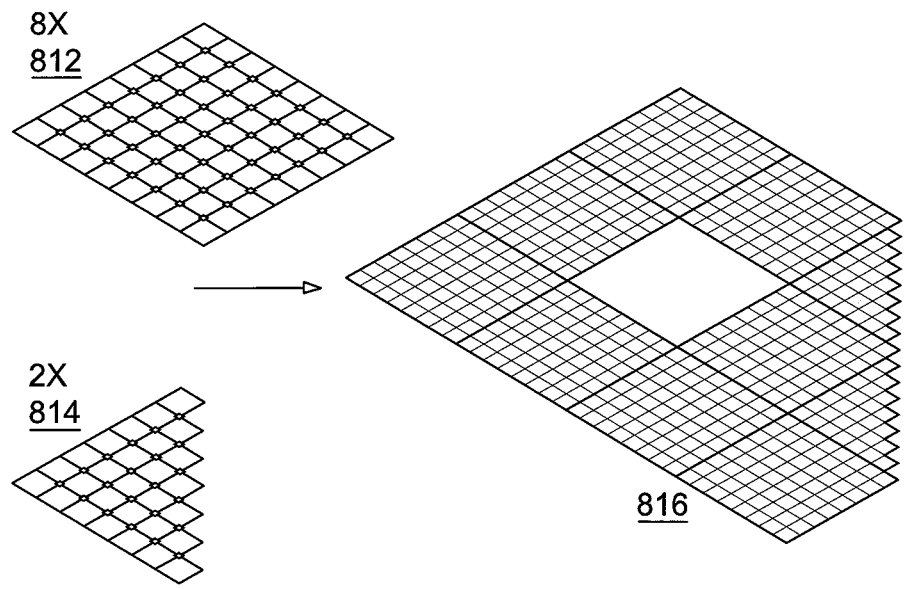

An appropriate set of segmented modules is then provided 606. The set may include laminate segments of various shapes that may be arranged to fill the geometric envelope determined from the survey data. For example, as shown in FIG. 8B, the geometric envelope 802 of FIG. 8A may be filled with a single segmented module comprised of eight square-shaped laminate segments 812 and two triangular-shaped laminate segments 814. More generally, multiple segmented large-area modules may be created from sets of laminate segments, each large-area module being created within a predetermined build envelope.

The laminate segments (for example, 812 and 814) of the set may be advantageously joined/interconnected at a manufacturing facility to form 607 the segmented large-area module(s) 816. The segmented large-area module(s) 816 is (are) then transported to the installation site. This embodiment is described in further detail below in relation to FIGS. 9, 10A, 10B and 10C.

Figure 9:
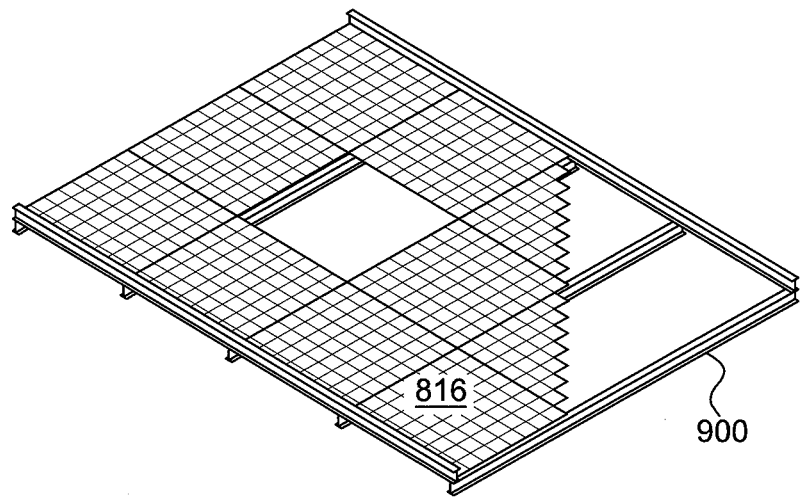
FIG. 9 depicts the segmented large-area module mounted on a carrier frame in accordance with an embodiment of the invention.

The segmented modules are then transported 608 to the installation site. If the set has been previously joined 607 into one or more large-area module(s), then each large-area module may be mounted on a carrier frame prior to transport. An example of a carrier frame 900 with a large-area module 816 mounted thereon is illustrated in FIG. 9.

Figure 10A:
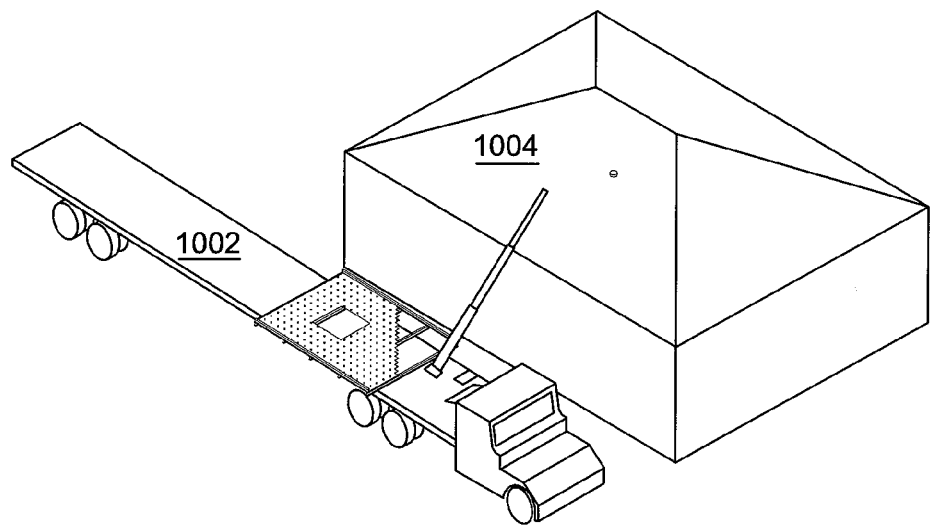
FIG. 10A illustrates the pre-assembled segmented large-area module on the carrier frame arriving on site in accordance with an embodiment of the invention.
Figure 10B:
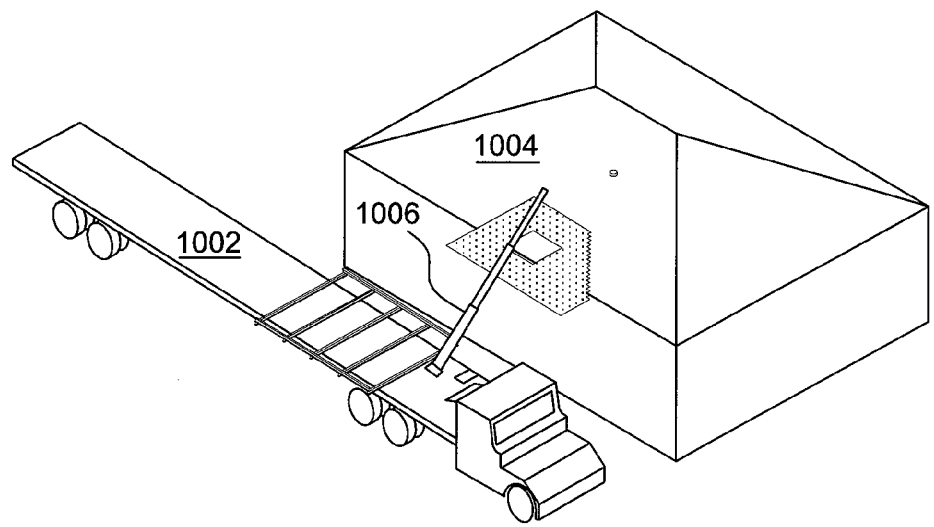
FIG. 10B illustrates the lifting of the carrier frame onto the roof in accordance with an embodiment of the invention.
Figure 10C:
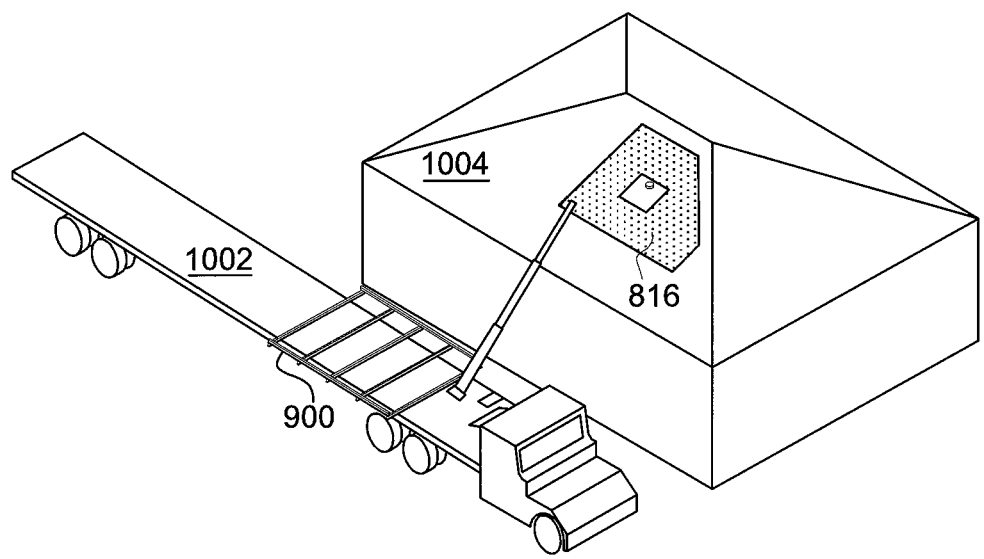
FIG. 10C illustrates the segmented large-area module as installed on the roof area in accordance with an embodiment of the invention.

The laminate segments are then installed 610 at the installation site. If the set has been previously joined 607 into one or more large-area module(s), then one or more pre-assembled large-area module(s) may arrive on site on a carrier frame as transported by a truck 1002, for example. FIG. 10A illustrates the pre-assembled segmented large-area module on the carrier frame arriving on site in accordance with an embodiment of the invention. FIG. 10B shows the large-area module being lifted onto the roof installation site 1004 by way of a crane 1006 lifting the carrier frame. FIG. 10C depicts the large-area module 806 after installation. The carrier frame 900 may be placed back on the truck 1002 for return. Other array panels or modules may be installed similarly. Alternatively, smaller segmented modules may be manually lifted onto the roof for installation.

In another embodiment, the segmented module(s) may have sufficient rigidity such that a carrier frame would not be needed. In that case, the segmented module(s) may be lifted into place directly and secured to the roof (or other installation site).

In a further embodiment, mounting pins or attachments may be placed on a roof (or other site), and the segmented module(s) may be lifted into place and secured to them.

"Fractal" Set of Smaller Segmented Photovoltaic Modules

Figure 11:
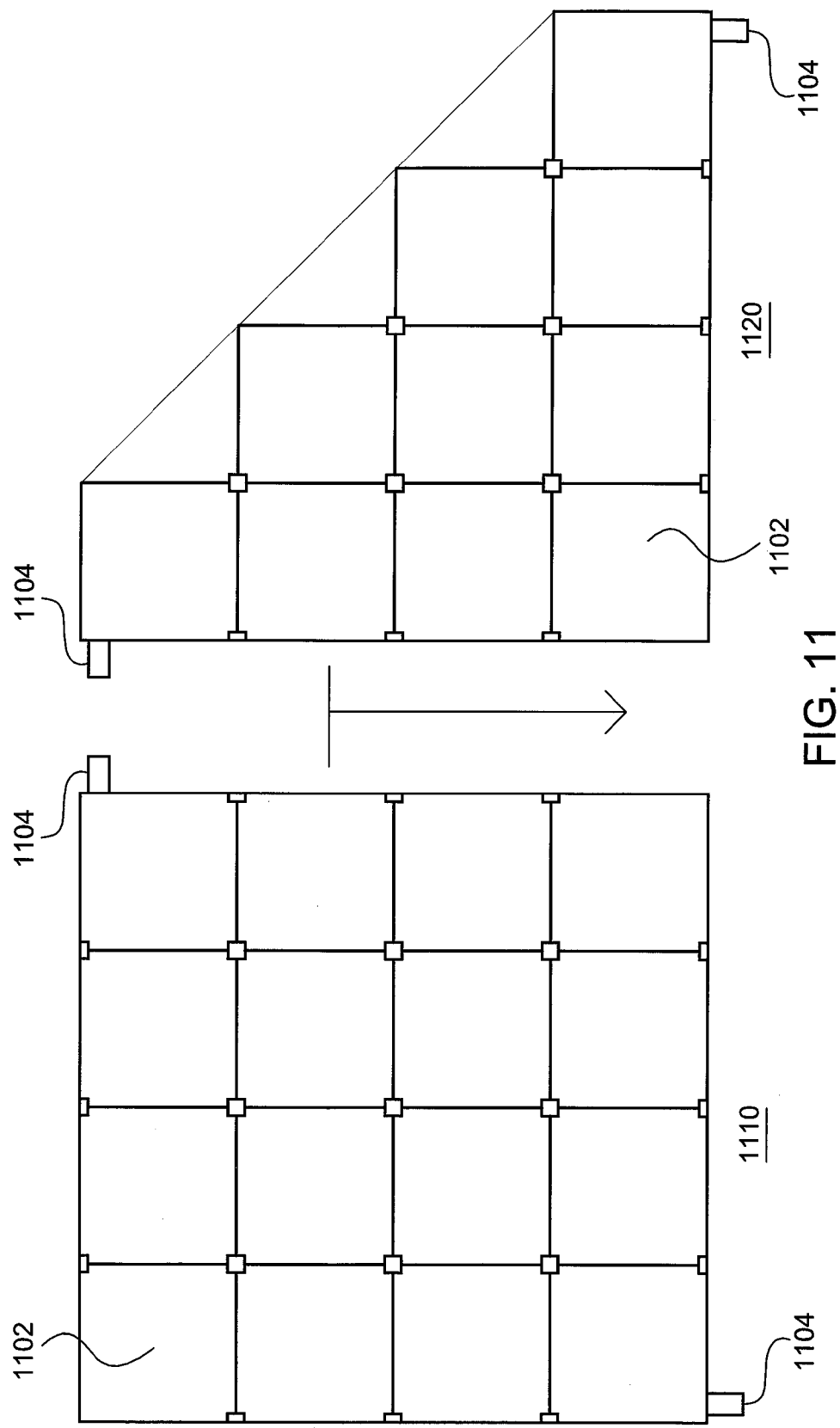
FIG. 11 is a schematic diagram depicting two example smaller laminate segments in accordance with an embodiment of the invention.

FIG. 11 is a schematic diagram depicting two example smaller laminate segments in accordance with an embodiment of the invention. Each of these smaller laminate segments may have fewer solar cells 1102 than a typical conventional solar module. A typical conventional solar module is made from a rectangular laminate which may have seventy-two solar cells, for example. Each module segment may include conductive exit tabs 1104 on two of its sides for electrically interconnecting the segment with neighboring segments. The exit tabs 1104 are interconnected electrically with a string of solar cells 1102 in that segment.

The first example module segment 1110 is made from a square-shaped mini-laminate which includes sixteen solar cells. The second example module segment 1120 is made from an approximately triangular-shaped (actually, a square with a corner cut off) mini-laminate which includes ten solar cells. Of course, other shapes and sizes of laminate segments may be created, and they may include various numbers of solar cells.

Figure 12:
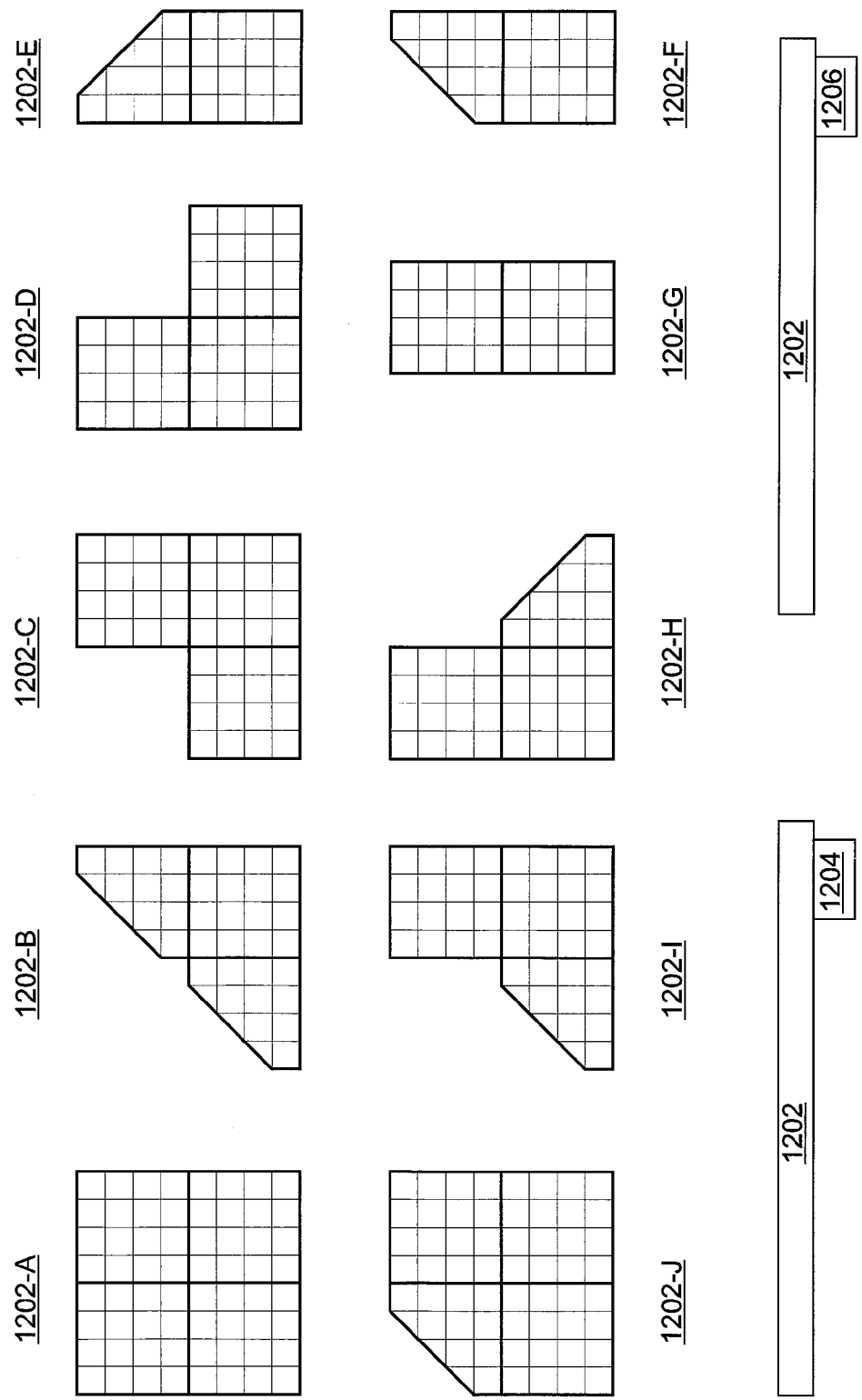
FIG. 12 depicts a "fractal" set of ten different segmented PV modules in accordance with an embodiment of the invention.

FIG. 12 depicts a flexible ("fractal") set of ten segmented PV modules 1202 formed from the square and triangular laminate segments of FIG. 11 in accordance with an embodiment of the invention. Each of these ten segmented PV modules has a different shape from the others. In accordance with an embodiment of the invention, each of these segmented PV modules may include a junction box 1204 (for example, on the back-side of the module) for connecting the modules in series, which may incorporate a series DC power converter. In an alternate embodiment, each segmented PV module may include a micro-inverter or parallel DC power converter 1206 such that the module outputs AC or DC power to a common bus for a photovoltaic array.

As described further below, these different shapes may be combined in a flexible manner so as to create PV arrays filling custom-shaped envelopes. The electrical interconnections between the laminate segments may be formed, for example, by soldering the exit tabbing, as appropriate, to form the desired string or strings of solar cells. Exit tabbing at the ends of a string of solar cells may be interconnected to the junction box 1204.

The first segmented PV module 1202-A comprises an 8-by-8 square module of solar cells. It is formed by mechanically joining and electrically interconnecting four of the square PV segments 1110.

The second segmented PV module 1202-B comprises a triangle-like module of 36 solar cells. It is formed by mechanically joining and electrically interconnecting one square PV segment 1110 with two of the triangular PV segments 1120.

The third segmented PV module 1202-C comprises a corner-shaped module of 48 solar cells. It is formed by mechanically joining and electrically interconnecting three square PV segments 1110.

The fourth segmented PV module 1202-D comprises another corner-shaped module of 48 solar cells. It is also formed by mechanically joining and electrically interconnecting three square PV segments 1110.

The fifth segmented PV module 1202-E comprises a module of 26 solar cells. It is formed by mechanically joining and electrically interconnecting one square PV segment 1110 with one triangular PV segment 1120.

The sixth segmented PV module 1202-F comprises another module of 26 solar cells. It is also formed by mechanically joining and electrically interconnecting one square PV segment 1110 with one triangular PV segment 1120.

The seventh segmented PV module 1202-G comprises a rectangular module of 32 solar cells. It is formed by mechanically joining and electrically interconnecting two square PV segments 1110.

The eighth PV module 1202-H comprises a module of 42 solar cells. It is formed by mechanically joining and electrically interconnecting two square PV segments 1110 with one triangular PV segment 1120.

The ninth segmented PV module 1202-I comprises another module of 42 solar cells. It is also formed by mechanically joining and electrically interconnecting two square PV segments 1110 with one triangular PV segment 1120.

The tenth segmented PV module 1202-J comprises another module of 58 solar cells. It is also formed by mechanically joining and electrically interconnecting three square PV segments 1110 with one triangular PV segment 1120.

FIG. 13A depicts the surface coverage on a section of an example roof area using an arrangement 1300 of conventional rectangular PV modules. In this example, the conventional rectangular PV modules have 72 solar cells each. The arrangement of the conventional rectangular modules covers the area 1302 depicted and leaves the remainder 1304 of the roof area uncovered. In this case, the conventional modules covering the area 1302 have a capacity to generate 6.4 kilowatts of solar energy.

Figure 13B:
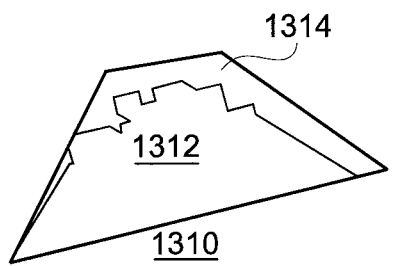
FIG. 13B depicts the surface coverage on the same section of the roof using a first arrangement of segmented PV modules in accordance with an embodiment of the invention.

FIG. 13B depicts the surface coverage on the same section of the roof using a first arrangement 1310 of segmented PV modules 1202 in accordance with an embodiment of the invention. In this example, a varied set of segmented PV modules 1202 of the types (A through J) shown in FIG. 12 are arranged to cover the irregular area 1312 depicted and leave the remainder 1314 of the roof area uncovered. In this case, the segmented PV modules 1202 covering the area 1312 have a capacity to generate 8.1 kilowatts of solar energy, which is substantially greater than the capacity of the conventional PV modules in FIG. 13A.

Figure 13C:
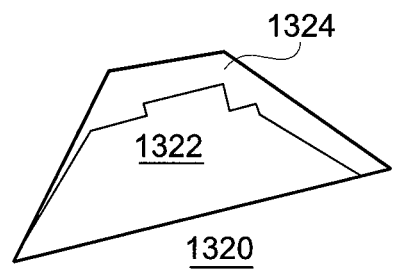
FIG. 13C depicts the surface coverage on the same section of the roof using a second arrangement of segmented PV modules in accordance with an embodiment of the invention.

FIG. 13C depicts the surface coverage on the same section of the roof using a second arrangement 1320 of segmented PV modules 1202 in accordance with an embodiment of the invention. In this example, a different set of segmented PV modules 1202 of the types (A through J) shown in FIG. 12 are arranged to cover the area 1322 depicted and leave the remainder 1324 of the roof area uncovered. In this case, the segmented PV modules 1202 covering the area 1322 have a capacity to generate 8.0 kilowatts of solar energy, which is substantially greater than the capacity of the conventional PV modules in FIG. 13A.

Figure 14:
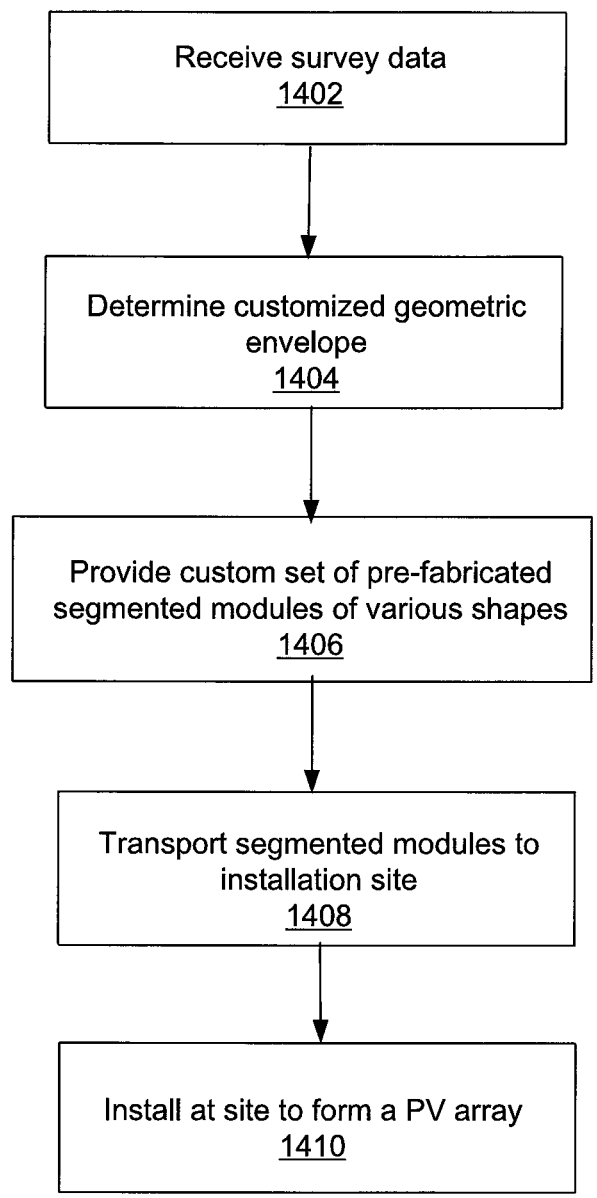
FIG. 14 is a flow chart of a process for creating and installing a customized set of pre-fabricated segment modules in accordance with an embodiment of the invention.

FIG. 14 is a flow chart of a process 1400 for creating and installing a customized set of pre-fabricated segment modules in accordance with an embodiment of the invention. This process 1400 may advantageously utilize the "fractal" set of segmented PV modules 1202 discussed above in relation to FIG. 12.

Survey data of the installation site may be received 1402 and a customized geometric envelope for installation of a PV array may be determined 1404 from the survey data. These steps 1402 and 1404 are similar to steps 602 and 604 of FIG. 6. However, in this case, the various shapes in the fractal set of segmented modules allow the geometric envelope to be very flexible in terms of its shape. Examples of such flexible geometric envelopes (1312 and 1322) are shown in FIGS. 13B and 13C, as described above.

The geometric envelope is determined 1404 such that it may be filled using a custom set of pre-fabricated segmented modules of various shapes. For example, a first custom set comprising various of the segmented modules 1202 shown in FIG. 12 may be arranged to fill the geometric envelope 1312 shown in FIG. 13B, while a second (different) custom set comprising various of the segmented modules 1202 shown in FIG. 12 may be arranged to fill the geometric envelope 1314 shown in FIG. 13C. The custom set so determined is provided 1406 and transported 1408 to the installation site. The custom set may then be installed 1410 at the site to form the PV array within the customized geometric envelope.

In an alternate process, an inventory of segmented modules of various shapes may be kept on a truck and brought to an installation site. A determination may be made at the installation site as to the segmented modules to be installed and the array layout. The installer may then retrieve those modules from the inventory on the truck and install them according to the array layout.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of manufacturing a large-area segmented photovoltaic module from photovoltaic laminate segments of various shapes, the method being performed at a manufacturing facility and comprising:
mechanically joining a plurality of the photovoltaic laminate segments of various shapes to fill a predetermined envelope for the segmented photovoltaic module;
electrically interconnecting the plurality of photovoltaic laminate segments;
forming a protective cover for the electrical interconnections; and
integrating a junction box with the module for connecting to the segmented photovoltaic module.

2. The method of manufacturing of claim 1, wherein the shapes of the photovoltaic laminate segments include non-rectangular shapes.

3. The method of manufacturing of claim 2, wherein the non-rectangular shapes include approximately-triangular shapes.

4. A method of manufacturing a large-area segmented photovoltaic module from laminate segments of various shapes, the method being performed at a manufacturing facility and comprising:
mechanically joining a plurality of the laminate segments of various shapes to fill a predetermined envelope for the segmented photovoltaic module;
electrically interconnecting the plurality of laminate segments;
forming a protective cover for the electrical interconnections;
integrating a junction box with the module for connecting to the segmented photovoltaic module; and
soldering tabbing together to form the electrical interconnections between the laminate segments.

5. A method of manufacturing a large-area segmented photovoltaic module from laminate segments of various shapes, the method being performed at a manufacturing facility and comprising:
mechanically joining a plurality of the laminate segments of various shapes to fill a predetermined envelope for the segmented photovoltaic module;
electrically interconnecting the plurality of laminate segments;
forming a protective cover for the electrical interconnections;
integrating a junction box with the module for connecting to the segmented photovoltaic module; and
attaching stiffening ribs to form the mechanical interconnections between the laminate segments and to protect the electrical interconnections.

6. The method of manufacturing of claim 5, further comprising:
encapsulating the electrically interconnections by filling the stiffening ribs with an elastomer.

7. A method of manufacturing a large-area segmented photovoltaic module from laminate segments of various shapes, the method being performed at a manufacturing facility and comprising:
mechanically joining a plurality of the laminate segments of various shapes to fill a predetermined envelope for the segmented photovoltaic module;
electrically interconnecting the plurality of laminate segments;
forming a protective cover for the electrical interconnections;
integrating a junction box with the module for connecting to the segmented photovoltaic module; and
integrating a DC-to-AC micro-inverter or DC-to-DC power converter with the segmented photovoltaic module so that the module outputs AC or conditioned DC power.

* * * * *